US010996701B1

(12) United States Patent
Wu et al.

(10) Patent No.: US 10,996,701 B1
(45) Date of Patent: May 4, 2021

(54) POWER CONVERTER HAVING FAST TRANSIENT RESPONSE

(71) Applicant: ANPEC ELECTRONICS CORPORATION, Hsinchu (TW)

(72) Inventors: Tse-Hsu Wu, Hsinchu (TW); Fu-Chuan Chen, Hsinchu (TW); Yun-Chiang Chang, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 17/027,857

(22) Filed: Sep. 22, 2020

(30) Foreign Application Priority Data

Aug. 3, 2020 (TW) .................. 109126146

(51) Int. Cl.
G05F 1/56 (2006.01)
G05F 1/575 (2006.01)
G01R 19/165 (2006.01)
H03K 5/24 (2006.01)

(52) U.S. Cl.
CPC ....... G05F 1/575 (2013.01); G01R 19/16576 (2013.01); H03K 5/24 (2013.01)

(58) Field of Classification Search
CPC . G05F 1/56; G05F 1/561; G05F 1/562; G05F 1/565; G05F 1/575; G01R 19/16566; G01R 19/16576; H03K 5/08; H03K 5/22; H03K 5/24; H02M 3/156; H02M 3/1566; H02M 3/158
See application file for complete search history.

(56) References Cited

U.S. PATENT DOCUMENTS 9,651,959 B2 * 5/2017 Chen ................ H02M 3/158
2015/0364997 A1 * 12/2015 Deng ............... H02M 3/1582
323/271
2017/0023959 A1 * 1/2017 Chen ................ H02M 3/158

* cited by examiner

Primary Examiner — Long Nguyen
(74) Attorney, Agent, or Firm — Li & Cai Intellectual Property (USA) Office

(57) ABSTRACT

A power converter having fast transient response is provided. The power converter includes a voltage detector circuit and a compensator circuit. The voltage detector circuit includes a plurality of resistors, a plurality of comparators, and a detection control circuit. The resistors are connected in series with each other and grounded. First and second terminals of one of the resistors are respectively connected to a reference voltage and a first terminal of the adjacent resistor. First and second terminals of another of the resistors are respectively connected to a second terminal of the adjacent resistor and grounded. First input terminals of the comparators are respectively connected to second terminals of the resistors. The detection control circuit outputs control signals according to comparison signals. The compensator circuit outputs a compensating signal according to the control signals. A main control circuit controls switch circuits according to the compensating signal.

8 Claims, 9 Drawing Sheets

POWER CONVERTER HAVING FAST TRANSIENT RESPONSE

CROSS-REFERENCE TO RELATED PATENT APPLICATION

This application claims the benefit of priority to Taiwan Patent Application No. 109126146, filed on Aug. 3, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having fast transient response.

BACKGROUND OF THE DISCLOSURE

In recent years, with the advancement of technology, electronic products with various functions have been gradually developed. The electronic products with various functions can meet different requirements and have become an indispensable part of people's daily lives, making people's lives more convenient. The various electronic products with different functions are composed of various electronic components, and each of the electronic components requires different power supply voltages. Therefore, in order to make the electronic products with various functions function properly, a power convertor circuit needs to convert an input voltage into an appropriate voltage to be supplied to the electronic components.

SUMMARY OF THE DISCLOSURE

In response to the above-referenced technical inadequacies, the present disclosure provides a power converter having fast transient response includes a voltage detector circuit, a compensator circuit, a main control circuit and a switch circuit. The voltage detector circuit includes a plurality of resistors, a plurality of comparators and a detection control circuit. The resistors are connected in series with each other and grounded. A first terminal of one of the plurality of resistors is coupled to a first reference voltage. A second terminal of the one resistor is connected to the resistor that is disposed adjacent to the one resistor. A first terminal of another of the plurality of resistors is connected to a second terminal of the resistor that is disposed adjacent to the another resistor. A second terminal of the another resistor is grounded. A first terminal and a second terminal of each of others of the plurality of resistors are respectively disposed adjacent to two of the plurality of resistors, and respectively connected to a second terminal of one of the two resistors and a first terminal of the other of the two resistors. Each of the comparators has a first input terminal and a second input terminal. The first input terminals of the plurality of comparators are respectively connected to the second terminals of the plurality of first resistors. The second input terminal of each of the plurality of comparators is coupled to a trigger voltage. Each of the plurality of comparators is configured to output a comparison signal according to a voltage of the first input terminal of the comparator and a voltage of the second input terminal of the comparator. The detection control circuit is connected to an output terminal of each of the plurality of comparators and configured to output a control signal according to each of the comparison signals. The compensator circuit is connected to the detection control circuit and configured to output a compensating signal according to the control signals. The main control circuit is connected to the compensator circuit and configured to output a main control signal according to the compensating signal. The switch circuit is connected to the main control circuit and configured to operate according to the main control signal.

In certain embodiments, the switch circuit is connected to a first terminal of an output inductor. A second terminal of the output inductor is connected in series with an output capacitor and grounded through the output capacitor. A voltage of an output node between the output inductor and the output capacitor is an output voltage of the power converter.

In certain embodiments, a voltage driver circuit is connected to the output node and configured to divide the output voltage to output a feedback voltage.

In certain embodiments, the compensator circuit includes a plurality of current sources, an error amplifier, a plurality of switch components, a plurality of switch components, a second resistor and a first capacitor. Two input terminals of the error amplifier are respectively coupled to a second reference voltage and connected to the voltage driver circuit. An output terminal of the error amplifier is connected to the current sources. First terminals of the plurality of switch components are respectively connected to the plurality of current sources. A control terminal of each of the plurality of switch components is connected to an output terminal of the detection control circuit. A first terminal of the second resistor is connected to a second terminal of each of the plurality of switch components and an input terminal of the main control circuit. A first terminal of the first capacitor is connected to a second terminal of the second resistor. A second terminal of the first capacitor is grounded.

In certain embodiments, the compensator circuit includes an error amplifier, a plurality of second resistors, a plurality of switch components and a capacitor. Two input terminals of the error amplifier are respectively coupled to a second reference voltage and connected to the voltage driver circuit. A first terminal of each of the plurality of second resistors is connected to an output terminal of the error amplifier and an input terminal of the main control circuit. First terminals of the plurality of switch components are respectively connected to second terminals of the plurality of second resistors. A control terminal of each of the plurality of switch components is connected to an output terminal of the detection control circuit. A terminal of the capacitor is connected to a second terminal of each of the plurality of switch components, and another terminal of the capacitor is grounded.

In certain embodiments, the compensator circuit includes an error amplifier, a second resistor, a plurality of switch components and a plurality of capacitors. Two input terminals of the error amplifier are respectively coupled to a second reference voltage and connected to the voltage driver circuit. A first terminal of the second resistor is connected to an output terminal of the error amplifier and an input terminal of the main control circuit. A first terminal of each of the plurality of switch components is connected to a second terminal of the second resistor. A control terminal of each of the plurality of switch components is connected to an output terminal of the detection control circuit. First terminals of the plurality of capacitors are respectively connected to second terminals of the plurality of switch components. A second terminal of each of the plurality of capacitors is grounded.

In certain embodiments, the compensator circuit includes an error amplifier, a second resistor, a second resistor, a first capacitor, a plurality of switch components, and a plurality of second capacitors. Two input terminals of the error amplifier are respectively coupled to a second reference voltage and connected to the voltage driver circuit. A first terminal of the second resistor is connected to an output terminal of the error amplifier and an input terminal of the main control circuit. A terminal of the first capacitor is connected to a second terminal of the second resistor and another terminal of the first capacitor is grounded. A first terminal of each of the plurality of switch components is connected to an output terminal of the error amplifier and the input terminal of the main control circuit. A control terminal of each of the plurality of switch components is connected to an output terminal of the detection control circuit. First terminals of the plurality of second capacitors are respectively connected to second terminals of the plurality of switch components. A second terminal of each of the plurality of second capacitors is grounded.

In certain embodiments, the compensator circuit includes an operational amplifier, a first capacitor, a second capacitor, a plurality of second resistors, and a plurality of switch components. The operational amplifier has a first input terminal and a second input terminal that are respectively coupled to a second reference voltage and connected to the voltage driver circuit. An output terminal of the operational amplifier is connected to an input terminal of the main control circuit. A first capacitor is connected between the first input terminal of the operational amplifier and the output terminal of the operational amplifier. A first terminal of the second capacitor is connected to the first input terminal of the operational amplifier. The second resistors are connected in series with the second capacitor and connected between the first input terminal of the operational amplifier and the output terminal of the operational amplifier. The switch components are respectively connected in parallel with the plurality of second resistors and connected to an output terminal of the detection control circuit.

As described above, the present disclosure provides the power converter having the fast transient response. Only a small amount of capacitors need to be disposed in the power converter for realizing a fast transient response effect without disposing any additional external pin in the power converter.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
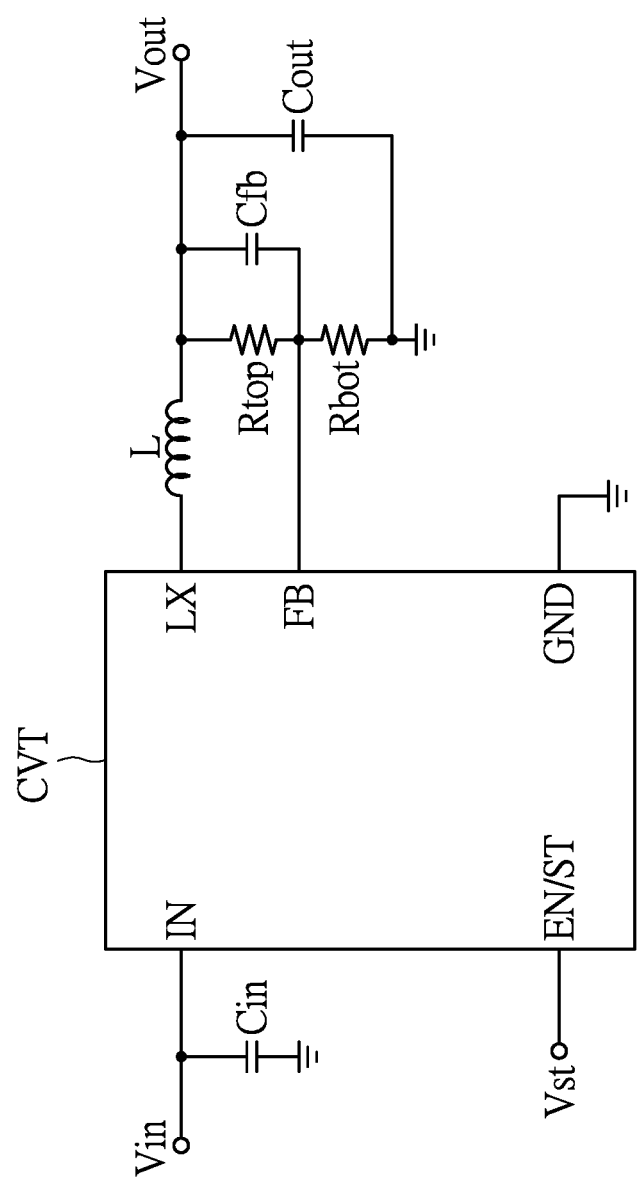
FIG. 1 is a circuit layout diagram of a power converter having fast transient response and external components according to first to sixth embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of a power converter having fast transient response and external components according to first to sixth embodiments of the present disclosure.

In the embodiments, a power converter CVT having fast transient response may have an input terminal IN, an enable terminal EN or a trigger terminal ST, an output terminal LX, a feedback terminal FB, and a ground terminal GND. As shown in FIG. 1, the enable terminal EN is merged with the trigger terminal ST, but they may be disposed separately in practice. The input terminal IN of the power converter CVT is connected to a first terminal of an input capacitor Cin. The first terminal of the input capacitor Cin is connected to an input voltage source (that is not shown in figures) A second terminal of the input capacitor Cin is grounded. The input voltage source supplies an input voltage Vin for charging the input capacitor Cin. The trigger terminal ST of the power converter CVT is connected to a trigger circuit (that is not shown in figures) and receives a trigger voltage Vst from the trigger circuit. The ground terminal GND of the power converter CVT is grounded.

The output terminal LX of the power converter CVT is connected to a first terminal of an output inductor L. A second terminal of the output inductor L is connected in series with an output capacitor Cout and grounded through the output capacitor Cout. A voltage of an output node between the output inductor L and the output capacitor Cout is an output voltage Vout of the power converter CVT. A voltage driver circuit is connected to the output node between the output inductor L and the output capacitor Cout. The voltage driver circuit is configured to divide the output voltage Vout of the power converter CVT to output a feedback voltage.

In detail, the voltage driver circuit includes a first voltage driver resistor Rtop and a second voltage driver resistor Rbot. A first terminal of the first voltage driver resistor Rtop is connected to the output node between the output inductor L and the output capacitor Cout. A second terminal of the first voltage driver resistor Rtop is connected to a first terminal of the second voltage driver resistor Rbot. A second terminal of the second voltage driver resistor Rbot is grounded. A feedback capacitor Cfb is connected in parallel with the first voltage driver resistor Rtop. The feedback terminal FB of the power converter CVT is connected to a feedback node between the first voltage driver resistor Rtop and the second voltage driver resistor Rbot, and obtains a voltage of the feedback node that is the feedback voltage described above.

Figure 2:
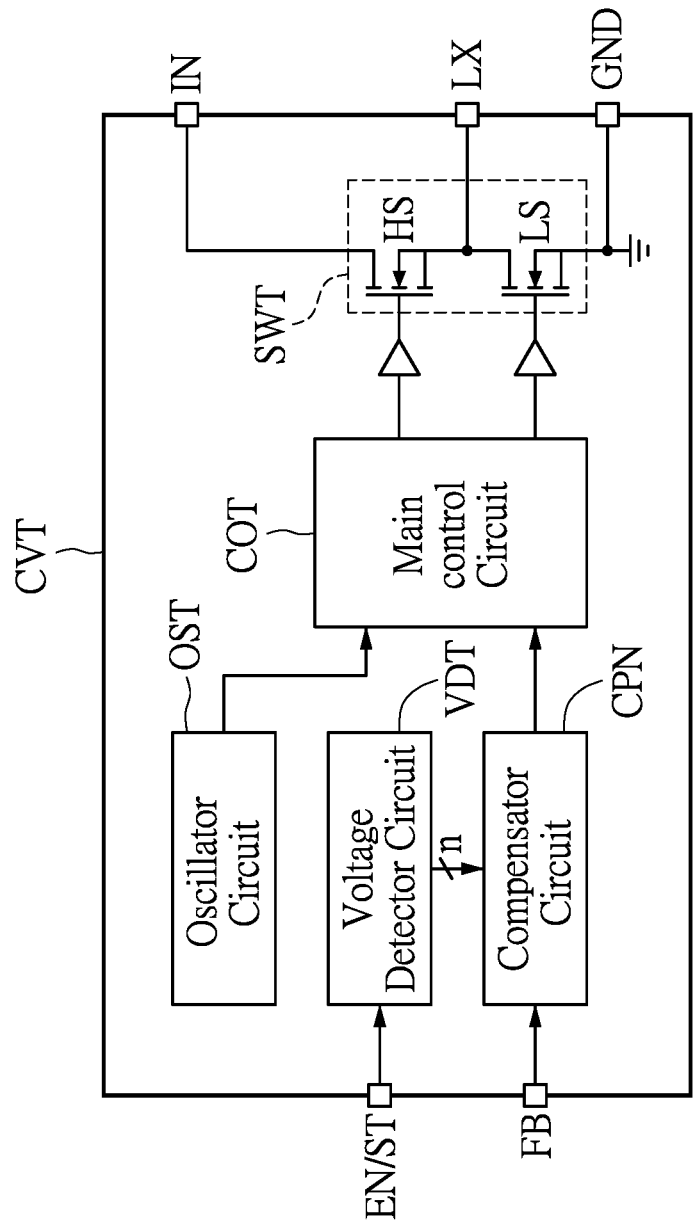
FIG. 2 is a circuit layout diagram of the power converter having the fast transient response according to the first to sixth embodiments of the present disclosure.

Reference is made to FIGS. 1 and 2, wherein FIG. 1 is a circuit layout diagram of a power converter having fast transient response and external components according to first to sixth embodiments of the present disclosure, and FIG. 2 is a circuit layout diagram of the power converter having the fast transient response according to the first to sixth embodiments of the present disclosure.

As shown in FIG. 2, in the embodiment, the power converter CVT includes a voltage detector circuit VDT, a compensator circuit CPN, an oscillator circuit OST, a main control circuit COT, and a switch circuit SWT. The voltage detector circuit VDT is connected to the compensator circuit CPN. The main control circuit COT is connected to the compensator circuit CPN, the oscillator circuit OST and the switch circuit SWT.

As shown in FIGS. 1 and 2, the voltage detector circuit VDT receives the trigger voltage Vst through the trigger terminal ST of the power converter CVT. The compensator circuit CPN is connected to the feedback node between the first voltage driver resistor Rtop and the second voltage driver resistor Rbot through the feedback terminal FB of the power converter CVT.

The switch circuit SWT includes a high-side switch HS and a low-side switch LS. A control terminal of the high-side switch H and a control terminal of the low-side switch LS are connected to an output terminal of the main control circuit COT. A first terminal of the high-side switch HS is connected to the first terminal of the input capacitor Cin through the input terminal IN of the power converter CVT, and receives a voltage of the input capacitor Cin such as the input voltage Vin.

A second terminal of the high-side switch HS is connected to a first terminal of the low-side switch LS. A second terminal of the low-side switch LS is grounded. A node between the high-side switch HS and the low-side switch LS of the switch circuit SWT is connected to the first terminal of an output inductor L through the output terminal LX of the power converter CVT.

When the voltage detector circuit VDT receives the trigger voltage Vst, the voltage detector circuit VDT detects the trigger voltage Vst to output a detection signal. The compensator circuit CPN receives the detection signal from the voltage detector circuit VDT and the feedback voltage from the voltage driver circuit, and outputs a compensating signal according to the detection signal and the feedback voltage. The main control circuit COT output a main control signal for controlling the switch circuit SWT according to the compensating signal.

Figure 3:
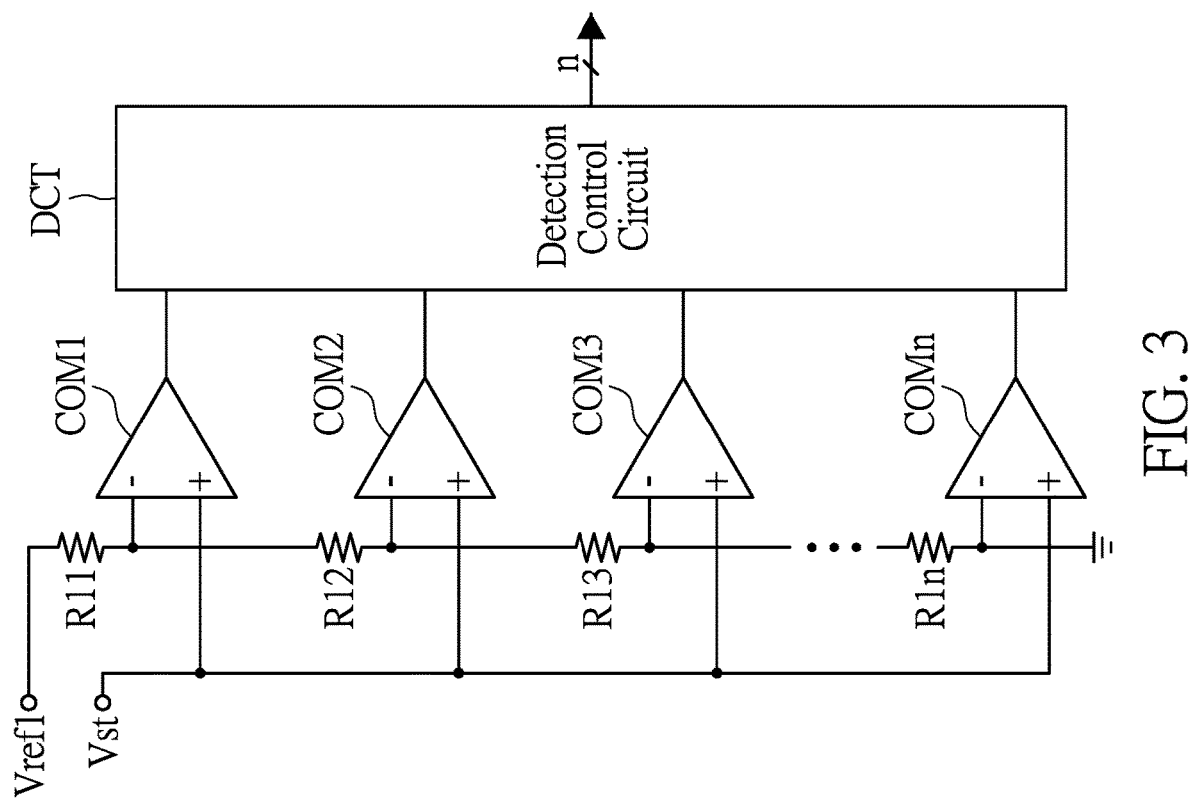
FIG. 3 is a circuit layout diagram of a voltage detector circuit of the power converter having the fast transient response according to the first embodiment of the present disclosure.

Reference is made to FIGS. 2 and 3, wherein FIG. 2 is a circuit layout diagram of the power converter having the fast transient response and the external components according to the first to sixth embodiments of the present disclosure, and FIG. 3 is a circuit layout diagram of a voltage detector circuit of the power converter having the fast transient response according to the first embodiment of the present disclosure.

For example, the voltage detector circuit VDT of the power converter CVT shown in FIG. 2 may include a plurality of first resistors R11 to R1$n$, a plurality of comparators COM1 to COM$n$, and a detection control circuit DCT as shown in FIG. 3. The first resistors R11 to R1$n$ are connected in series with each other and grounded, where n of R1$n$ may be any suitable integer value and represents the number of the first resistors. For example, if the five first resistors R11 to R15 are disposed, n=5. In practice, the number of the first resistors may be adjusted according to actual requirements, and the present disclosure is not limited thereto.

As shown in FIG. 3, a first terminal of the first resistor R11 is coupled to a first reference voltage Vref1, and a second terminal of the first resistor R11 is connected to a first terminal of the first resistor R12 that is disposed adjacent to the first resistor R11. A first terminal of the first resistor R1$n$ such as the first resistor R15 is connected to a first terminal of the adjacent first resistor R1$n$-1 such as the first resistor R14, and a second terminal of the first resistor R1$n$ is grounded.

A first terminal and a second terminal of each of the first resistors R12 to R1$n$−1 are respectively disposed adjacent to two of the resistors R11 to R1$n$, and respectively connected to a second terminal of one of the two resistors and a first terminal of the other of the two resistors. For example, the first resistor R12 is connected between the first resistor R11 and the first resistor R13 that are disposed adjacent to the first resistor R12. The first resistor R13 is connected between the first resistor R12 and the first resistor R14 that are disposed adjacent to the first resistor R13. The first resistor R14 is connected between the first resistor R13 and the first resistor R15 that are disposed adjacent to the first resistor R14. The first resistors R15 to R1n−1 are disposed in the above-mentioned manner.

The number of comparators COM1 to COMn may be equal to the number of first resistors R11 to R1n, but the present disclosure is not limited thereto. In practice, the number of comparators COM1 to COMn may be adjusted according to actual requirements. First input terminals such as inverting input terminals of the comparators COM1 to COMn are respectively connected to second terminals of the first resistors R11 to R15.

In detail, a first input terminal of the comparator COM1 is connected to a node between the first resistor R11 and the first resistor R12. A first input terminal of the comparator COM2 is connected to a node between the first resistor R12 and the first resistor R13. A first input terminal of the comparator COM3 is connected to a voltage dividing node between the first resistor R13 and the first resistor R14. The comparators COM4 to COMn and the first resistors R14 to R1n are disposed in a similar manner. Second input terminals such as non-inverting input terminals of the comparators COM1 to COMn are coupled to the trigger voltage Vst.

Each of the comparators COM1 to COMn is configured to compare a voltage of the first input terminal thereof with a voltage of the second input terminal thereof to output a comparison signal. For example, the comparator COM1 compares the trigger voltage Vst with a voltage of the node between the first resistor R11 and the first resistor R12 to output the comparison signal. The comparator COM2 compares the trigger voltage Vst with a voltage of the node between the first resistor R12 and the first resistor R13 to output the comparison signal. The comparators COM3 to COMn are configured in a similar manner.

That is, in the embodiment, the first reference voltage Vref1 is divided into a plurality of first reference divided voltages at different voltage levels respectively by the plurality of first resistors R11 to R1n. The first reference divided voltages are respectively inputted to the first input terminals of the comparators COM1 to COMn. The comparators COM1 to COMn compare each of the first reference divided voltages at the different voltage levels with the trigger voltage Vst to generate the comparison signal.

The detection control circuit DCT is connected to an output terminal of each of the comparators COM1 to COMn. The detection control circuit DCT is configured to output a control signal according to each of the comparison signals that are respectively outputted by the comparators COM1 to COMn. As shown in FIGS. 2 and 3, the compensator circuit CPN receives the plurality of control signals from the detection control circuit DCT of the voltage detector circuit VDT, and outputs the compensating signal according to the control signals. The number of control signals outputted by the detection control circuit DCT may be n. The main control circuit COT outputs the main control signal according to the compensating signal for controlling the switch circuit SWT.

Figure 4:
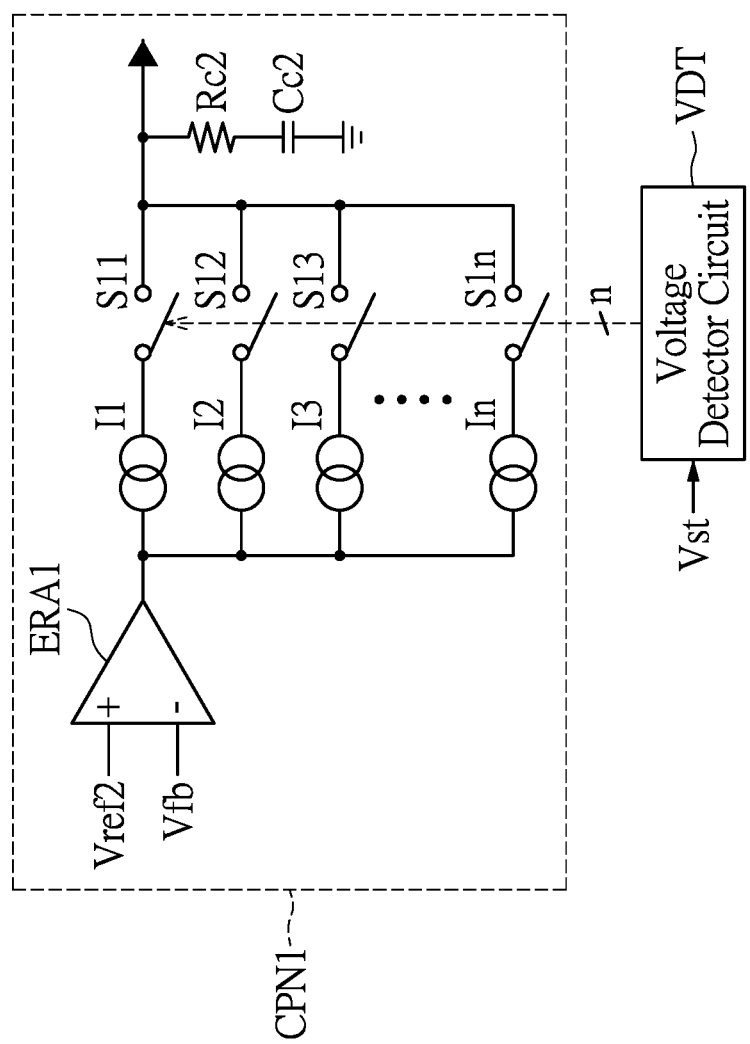
FIG. 4 is a circuit layout diagram of a compensator circuit of the power converter having the fast transient response according to the second embodiment of the present disclosure.

Reference is made to FIGS. 2 and 4, wherein FIG. 4 is a circuit layout diagram of a compensator circuit of the power converter having the fast transient response according to the second embodiment of the present disclosure.

As shown in FIG. 4, a compensator circuit CPN1 may include a plurality of current sources I1 to In, an error amplifier ERA1, a plurality of switch components S11 to S1n, a second resistor Rc2, and a first capacitor Cc2. The compensator circuit CPN of the power converter CVT shown in FIG. 2 may be the same as the compensator circuit CPN1 shown in FIG. 4.

A first input terminal such as a non-inverting input terminal of the error amplifier ERA1 is coupled to the second reference voltage Vref2. A second input terminal such as an inverting input terminal of the error amplifier ERA1 is connected to the feedback node between the first voltage divider resistor Rtop and the second voltage divider resistor Rbot of the voltage divider circuit as shown in FIG. 1. An output terminal of the error amplifier ERA1 is connected to a plurality of current sources I1 to In.

The current sources I1 to In are connected between the output terminal of the error amplifier ERA1 and the switch components S11 to S1n. First terminals of the switch components S11 to S1n are respectively connected to the current sources I1 to In. A second terminal of each of the switch components S11 to S1n is connected to a first terminal of the second resistor Rc2. A second terminal of the second resistor Rc2 is connected to a first terminal of the first capacitor Cc2. A second terminal of the first capacitor Cc2 is grounded. An input terminal of the main control circuit such as the main control circuit COT shown in FIG. 2 is connected to the first terminal of the second resistor Rc2. A control terminal of each of the switch components S11 to S1n is connected to an output terminal of the voltage detector circuit VDT shown in FIG. 4 or the detection control circuit DCT shown in FIG. 3.

When the trigger terminal ST of the power converter CVT shown in FIG. 1 receives the trigger voltage Vst, the voltage detector circuit VDT shown in FIGS. 2 and 4 detects the trigger voltage Vst and accordingly outputs detection signals to the switch components S11 to S1n to control the switch components S11 to S1n.

If the voltage detector circuit shown in FIG. 3 is used, the detection control circuit DCT outputs the control signals according to the comparison signals outputted by the comparators COM1 to COMn. The switch components S11 to S1n shown in FIG. 4 operate according to the control signals.

The current sources I1 to In are connected in parallel with other and may selectively connected to the output terminal of the error amplifier ERA1 to selectively supply currents to the error amplifier ERA1 such that a transconductance gain (gm) of the error amplifier ERA1 increases, for example, the transconductance gain is doubled. The error amplifier ERA1 multiplies a difference between the second reference voltage Vref2 and the feedback voltage Vfb by the increased transconductance gain (gm) to output an error amplified signal that is the compensating signal to the main control circuit COT. The main control circuit COT shown in FIG. 2 outputs the main control signal for controlling the switch circuit SWT such that a bandwidth of the power converter CVT increases according to the compensating signal. As a result, the power converter CVT has better load transient performance for a high frequency operation.

Figure 5:
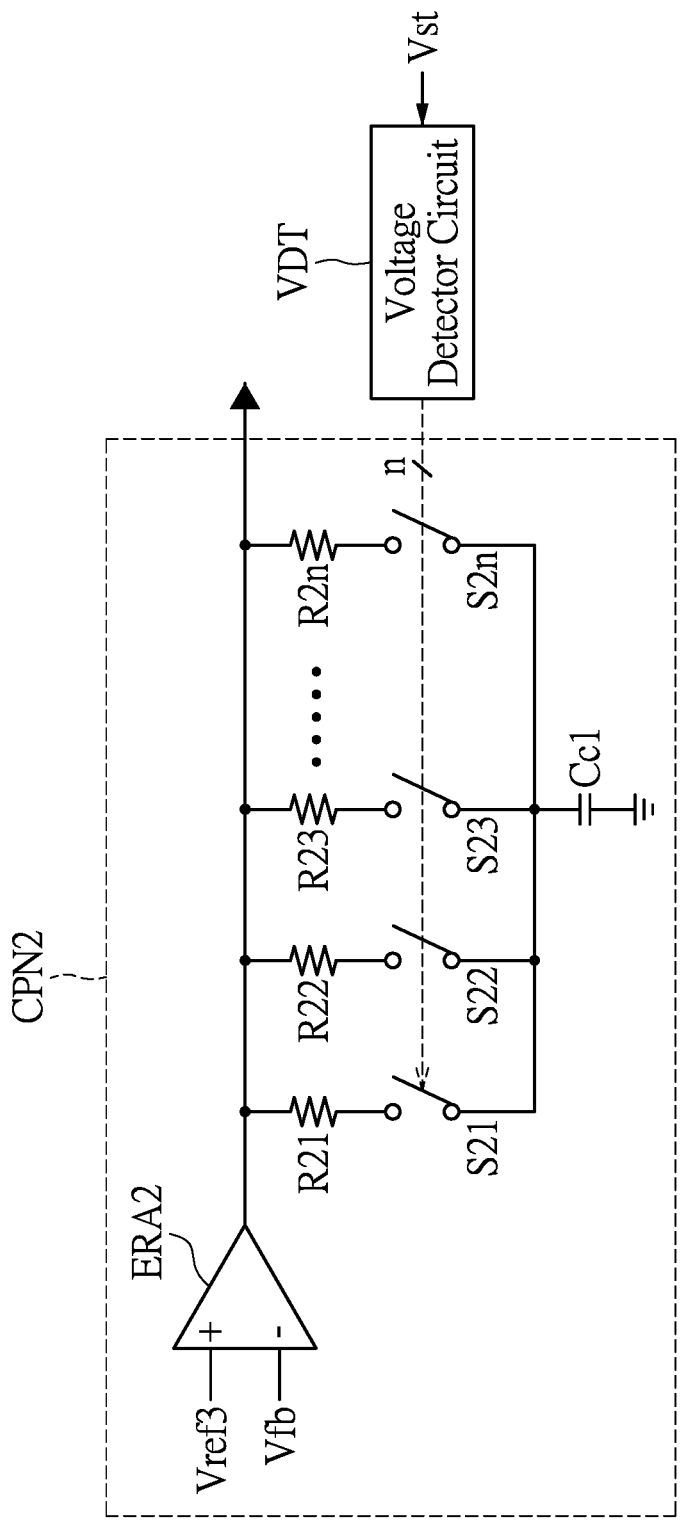
FIG. 5 is a circuit layout diagram of a compensator circuit of the power converter having the fast transient response according to the third embodiment of the present disclosure.

Reference is made to FIGS. 2 and 5, wherein FIG. 5 is a circuit layout diagram of a compensator circuit of the power converter having the fast transient response according to the third embodiment of the present disclosure. As shown in FIG. 5, a compensator circuit CPN2 may include an error amplifier ERA2, a plurality of second resistors R21 to R2n, a plurality of switch components S21 to S2n, and a capacitor Cc1. The compensator circuit CPN of the power converter CVT as shown in FIG. 2 may be the same as the compensator circuit CPN2 shown in FIG. 5.

A first input terminal of the error amplifier ERA2 is coupled to a second reference voltage Vref3. A second input terminal of the error amplifier ERA2 is connected to the feedback node between the first voltage divider resistor Rtop and the second voltage divider resistor Rbot of the voltage divider circuit as shown in FIG. 1. The feedback voltage Vfb shown in FIG. 5 is at the feedback node. An output terminal of the error amplifier ERA2 may be connected to the input terminal of the main control circuit such as the main control circuit COT shown in FIG. 2.

A first terminal of each of the second resistors R21 to R2$n$ is connected to the output terminal of the error amplifier ERA2. First terminals of the switch components S21 to S2$n$ are respectively connected to second terminals of the second resistors R21 to R2$n$ Control terminals of the switch components S21 to S2$n$ are connected to the output terminal of the voltage detector circuit VDT such as the detection control circuit DCT shown in FIG. 3. A first terminal of the capacitor Cc1 is connected to a second terminal of each of the switch components S21 to S2$n$. A second terminal of the capacitor Cc1 is grounded.

When the trigger terminal ST of the power converter CVT shown in FIG. 1 receives the trigger voltage Vst, the voltage detector circuit VDT shown in FIGS. 2 and 5 detects the trigger voltage Vst and outputs detection signals respectively to the switch components S21 to S2$n$ according to the trigger voltage Vst. The switch components S21 to S2$n$ operate according to the detection signals.

If the voltage detector circuit shown in FIG. 3 is used, the detection control circuit DCT outputs the plurality of control signals respectively according to the plurality of comparison signals that are respectively outputted by the comparators COM1 to COMn. The switch components S21 to S2$n$ shown in FIG. 5 operate according to the control signals.

As shown in FIG. 5, the error amplifier ERA2 multiplies a difference between the second reference voltage Vref3 and the feedback voltage Vfb by the transconductance gain (gm) to output error amplified signals such as current signals. When the switch components S21 to S2$n$ are turned on, the error amplified signals are allowed to flow to the capacitor Cc1 respectively through the switch components S21 to S2$n$ to charge the capacitor Cc1.

An input terminal of the main control circuit COT shown in FIG. 2 is connected to the first terminals of the second resistors R21 to R2$n$. The main control circuit COT may output a control signal for controlling the switch circuit SWT according to a voltage of the capacitor Cc1 and voltages of the second resistors R21 to R2$n$ that are the compensation signal.

Figure 6:
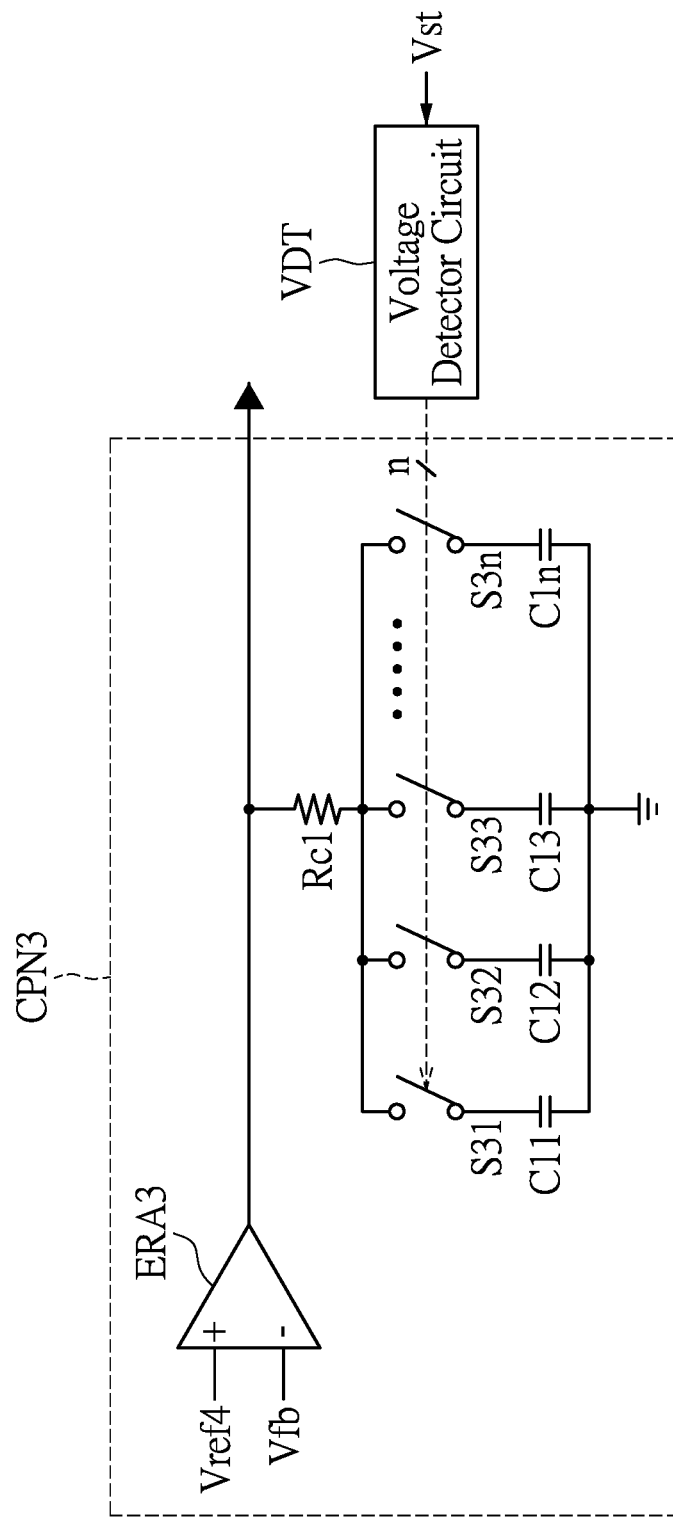
FIG. 6 is a circuit layout diagram of a compensator circuit of the power converter having the fast transient response according to the fourth embodiment of the present disclosure.

Reference is made to FIGS. 2 and 6, wherein FIG. 6 is a circuit layout diagram of a compensator circuit of the power converter having the fast transient response according to the fourth embodiment of the present disclosure.

As shown in FIG. 6, a compensator circuit CPN3 may include an error amplifier ERA3, a second resistor Rc1, a plurality of switch components S31 to S3$n$, and a plurality of capacitors C11 to C1$n$. The compensator circuit CPN of the power converter CVT as shown in FIG. 2 may be the same as the compensator circuit CPN3 shown in FIG. 6.

A control terminal of each of the switch components S31 to S3$n$ is connected to the output terminal of the voltage detector circuit VDT such as the detection control circuit DCT shown in FIG. 3. When the trigger terminal ST of the power converter CVT shown in FIG. 1 receives the trigger voltage Vst, the voltage detector circuit VDT shown in FIGS. 2 and 6 detects the trigger voltage Vst and outputs detection signals respectively to the switch components S31 to S3$n$ according to the trigger voltage Vst. The switch components S31 to S3$n$ operate according to the detection signals.

If the voltage detector circuit shown in FIG. 3 is used, the detection control circuit DCT outputs the plurality of control signals respectively according to the plurality of comparison signals that are respectively outputted by the comparators COM1 to COMn. The switch components S31 to S3$n$ shown in FIG. 6 operate according to the control signals.

A first input terminal of the error amplifier ERA3 is coupled to a second reference voltage Vref4. A second input terminal of the error amplifier ERA3 is connected to the feedback node between the first voltage divider resistor Rtop and the second voltage divider resistor Rbot of the voltage divider circuit as shown in FIG. 1. The feedback voltage Vfb shown in FIG. 6 is at the feedback node. A first terminal of the second resistor Rc1 is connected to an output terminal of the error amplifier ERA3. A first terminal of each of the switch components S31 to S3$n$ is connected to a second terminal of the second resistor Rc1. First terminals of the capacitors C11 to C1$n$ are respectively connected to second terminals of the switch components S31 to S3$n$. A second terminal of each of the capacitors C11 to C1$n$ is grounded.

The input end of the main control circuit COT shown in FIG. 2 is connected to the first terminal of the second resistor Rc1. The main control circuit COT may output a control signal for controlling the switch circuit SWT according to a voltage (that is the compensation signal) of a node between the input terminal of the main control circuit COT and the first terminal of the second resistor Rc1.

Figure 7:
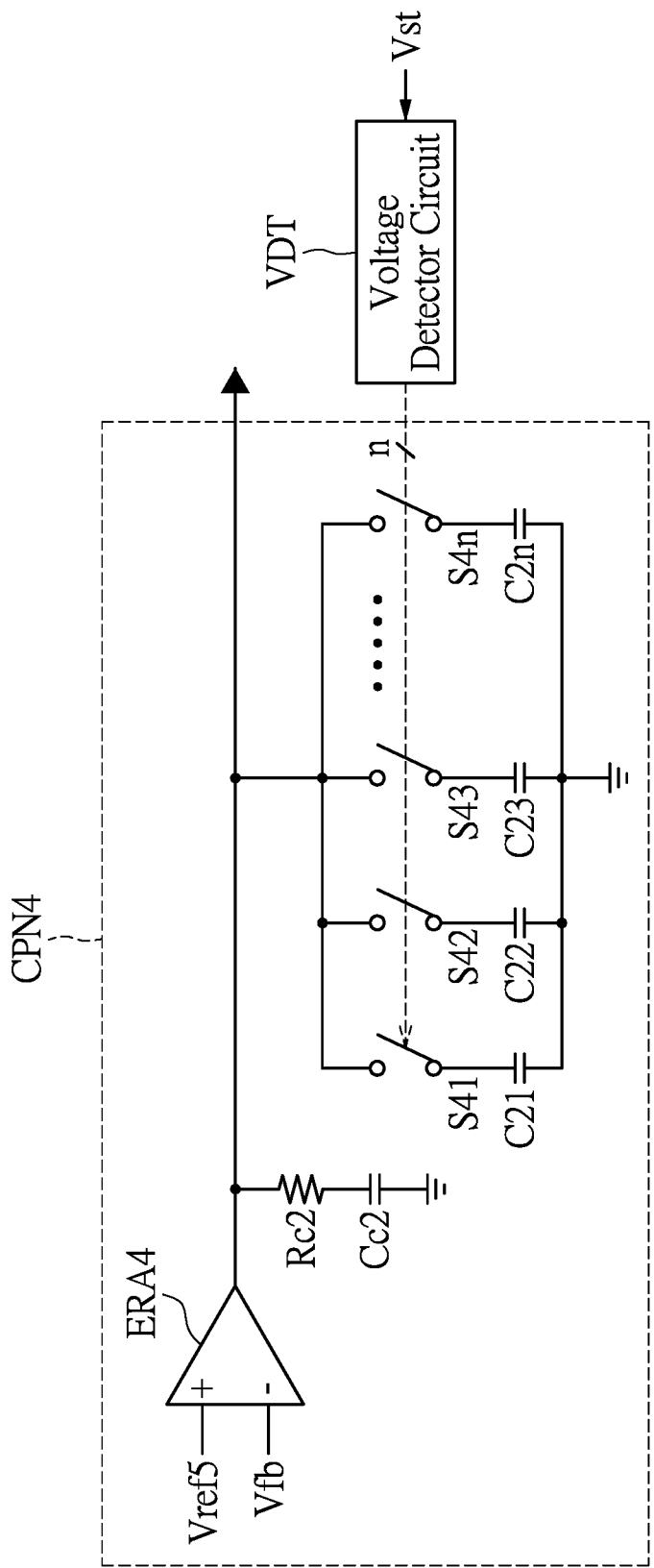
FIG. 7 is a circuit layout diagram of a compensator circuit of the power converter having the fast transient response according to the fifth embodiment of the present disclosure.

Reference is made to FIGS. 2 and 7, wherein FIG. 7 is a circuit layout diagram of a compensator circuit of the power converter having the fast transient response according to the fifth embodiment of the present disclosure.

As shown in FIG. 7, a compensator circuit CPN4 may include an error amplifier ERA4, a second resistor Rc2, a first capacitor Cc2, a plurality of switch components S41 to S4$n$, and a plurality of second capacitors C21 to C2$n$. The compensator circuit CPN of the power converter CVT as shown in FIG. 2 may be the same as the compensator circuit CPN4 shown in FIG. 7.

Control terminals of the switch components S41 to S4$n$ are connected to the output terminal of the voltage detector circuit VDT such as the detection control circuit DCT shown in FIG. 3. When the trigger terminal ST of the power converter CVT shown in FIG. 1 receives the trigger voltage Vst, the voltage detector circuit VDT shown in FIGS. 2 and 7 detects the trigger voltage Vst and outputs detection signals respectively to the switch components S41 to S4$n$ according to the trigger voltage Vst. The switch components S41 to S4$n$ operate according to the detection signals.

If the voltage detector circuit shown in FIG. 3 is used, the detection control circuit DCT outputs the plurality of control signals respectively according to the plurality of comparison signals that are respectively outputted by the comparators COM1 to COMn. The switch components S41 to S4$n$ shown in FIG. 7 operate according to the control signals.

A first input terminal of the error amplifier ERA4 is coupled to a second reference voltage Vref5. A second input terminal of the error amplifier ERA4 is connected to the feedback node between the first voltage divider resistor Rtop and the second voltage divider resistor Rbot of the voltage divider circuit. The feedback voltage Vfb shown in FIG. 7 is at the feedback node.

The first terminal of the second resistor Rc2 is connected to an output terminal of the error amplifier ERA4 and the input terminal of the main control circuit COT. The second terminal of the second resistor Rc2 is connected to the first terminal of the first capacitor Cc2. The second terminal of the first capacitor Cc2 is connected to the first terminal of the second resistor Rc2. The second terminal of the second resistor Rc2 is grounded.

A first terminal of each of the switch components S41 to S4$n$ is connected to the output terminal of the error amplifier ERA4 and the input terminal of the main control circuit COT. First terminals of the second capacitors C21 to C2$n$ are respectively to second terminals of the switch components S41 to S4$n$. Second terminals of the second capacitors C21 to C2$n$ are grounded.

The main control circuit COT may be configured to output a control signal for controlling the switch circuit SWT according to a voltage (that is the compensation signal) of a node between the input terminal of the main control circuit COT and the first terminals of the switch components S41 to S4$n$.

Figure 8:
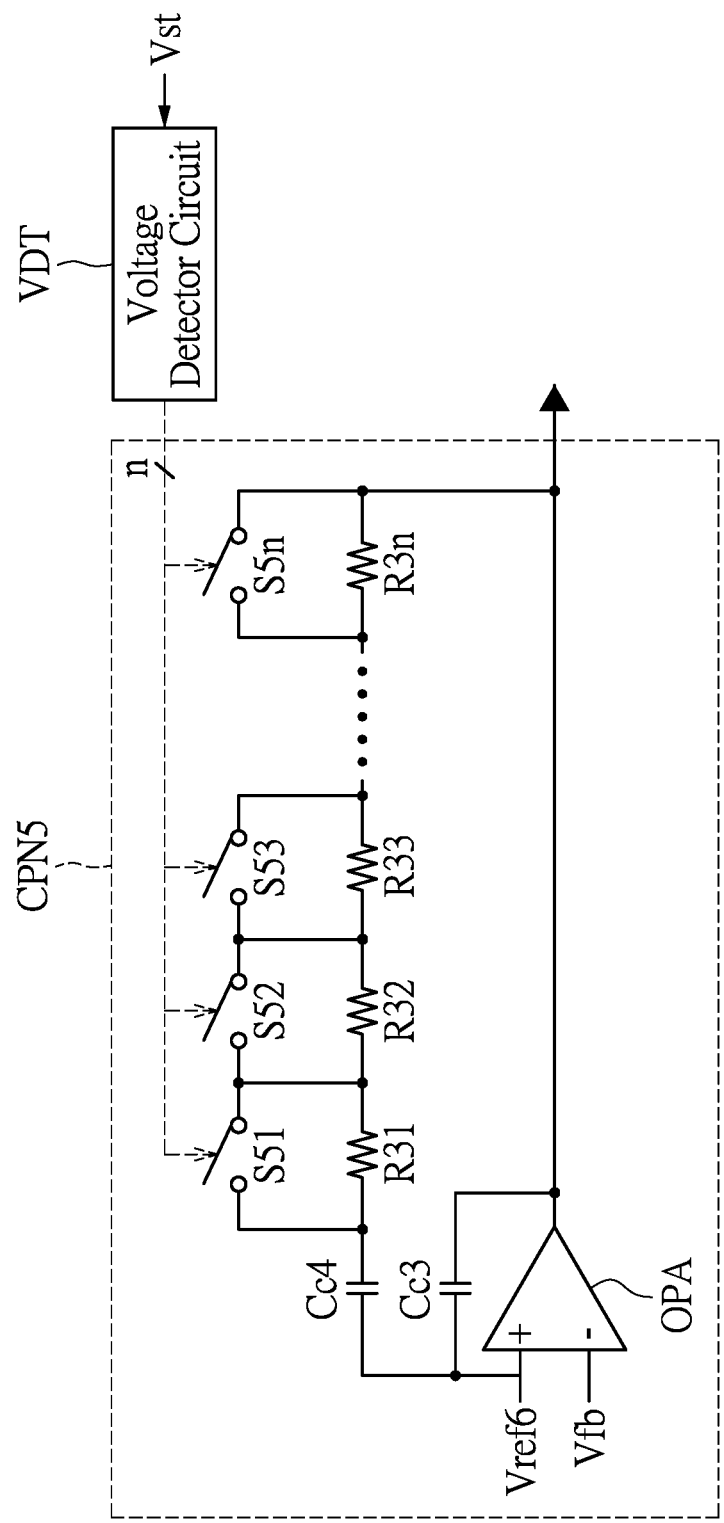
FIG. 8 is a circuit layout diagram of a compensator circuit of the power converter having the fast transient response according to the sixth embodiment of the present disclosure.

Reference is made to FIGS. 2 and 8, wherein FIG. 8 is a circuit layout diagram of a compensator circuit of the power converter having the fast transient response according to the sixth embodiment of the present disclosure.

As shown in FIG. 8, a compensator circuit CPN5 includes an operational amplifier OPA, a first capacitor Cc3, a second capacitor Cc4, a plurality of second resistors R31 to R3$n$, and a plurality of switch components S51 to S5$n$. The compensator circuit CPN of the power converter CVT shown in FIG. 2 may be the same as the compensator circuit CPN5 shown in FIG. 8.

A first input terminal such as a non-inverting input terminal of the operational amplifier OPA is coupled to a second reference voltage Vref6. A second input terminal such as an inverting input terminal) of the operational amplifier OPA is connected to the feedback node between the first voltage divider resistor Rtop and the second voltage divider resistor Rbot of the voltage divider circuit. The feedback voltage Vfb shown in FIG. 8 is at the feedback node. An output terminal of an operational amplifier OPA is connected to the input terminal of the main control circuit COT shown in FIG. 2.

The first capacitor Cc3 is connected between the first input terminal such as the non-inverting input terminal of the operational amplifier OPA and an output terminal of the operational amplifier OPA. A first terminal of the second capacitor Cc4 is connected to the first input terminal such as the non-inverting input terminal of the operational amplifier OPA. A second terminal of the second capacitor Cc4 is connected in series with the second resistors R31 to R3$n$.

Both of the second resistors R31 to R3$n$ and the second capacitor Cc4 are connected between the first input terminal such as the non-inverting input terminal of the operational amplifier OPA and the output terminal of the operational amplifier OPA. The switch components S51 to S5$n$ are respectively connected in parallel with the second resistors R31 to R3$n$. A control terminal of each of the switch components S51 to S5$n$ is connected to the output terminal of the voltage detector circuit VDT such as the detection control circuit DCT shown in FIG. 3.

When the trigger terminal ST of the power converter CVT shown in FIG. 1 receives the trigger voltage Vst, the voltage detector circuit VDT shown in FIGS. 2 and 8 detects the trigger voltage Vst and outputs detection signals respectively to the switch components S51 to S5$n$ according to the trigger voltage Vst. The switch components S51 to S5$n$ operate according to the detection signals.

If the voltage detector circuit shown in FIG. 3 is used, the detection control circuit DCT outputs the plurality of control signals respectively according to the plurality of comparison signals that are respectively outputted by the comparators COM1 to COM$n$. The switch components S51 to S5 shown in FIG. 8 operate according to the control signals.

Figure 9:
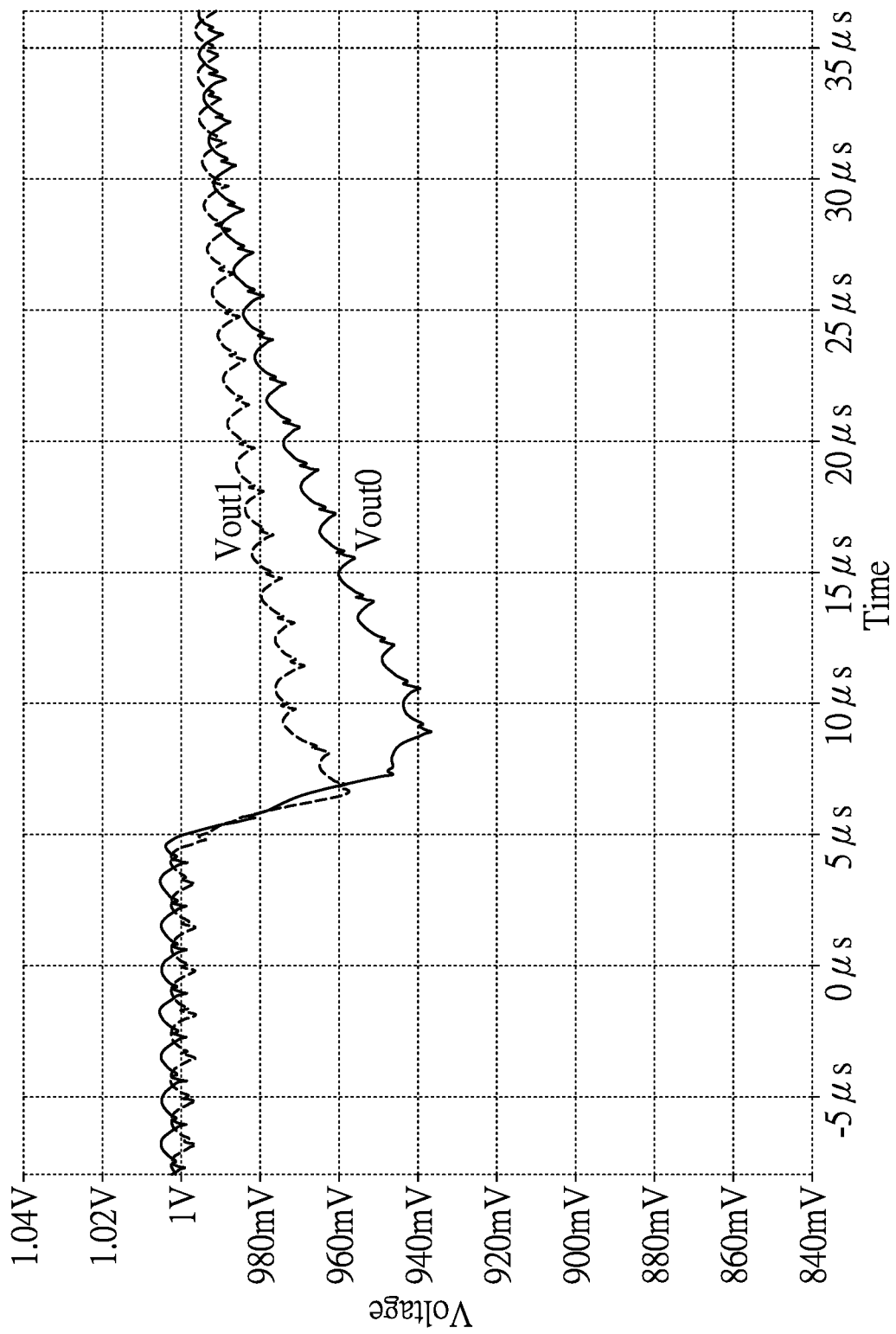
FIG. 9 is a curve diagram of output voltages of the power converter having the fast transient response according to the first to sixth embodiments of the present disclosure and a conventional power converter.

The operational amplifier OPA is configured to multiply a difference between a voltage of the first input terminal of the operational amplifier OPA and a voltage of the second input terminal of the operational amplifier OPA by a gain value to output the compensating signal to the main control circuit COT shown in FIG. 2. The main control circuit COT outputs a main control signal according to the compensating signal for controlling the switch circuit SWT. Reference is made to FIG. 9, which is a curve diagram of output voltages of the power converter having the fast transient response according to the first to sixth embodiments of the present disclosure and a conventional power converter.

As shown in FIG. 9, an output voltage signal Vout0 of the conventional power converter drops 66 mV. A voltage of an output voltage signal Vout of the power converter CVT having fast transient response as shown in FIG. 2 only drops 45 mV. It is apparent that, amplitude that the voltage outputted by the power converter CVT of the present disclosure drops is improved by 32%, compared with that of the conventional power converter.

In summary, the present disclosure provides the power converter having the fast transient response. Only a small amount of capacitors need to be disposed in the power converter for realizing a fast transient response effect without disposing any additional external pin in the power converter.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having fast transient response, comprising:
   a voltage detector circuit, including:
   a plurality of resistors connected in series with each other and grounded, wherein a first terminal of one of the plurality of resistors is coupled to a first reference voltage, a second terminal of the one resistor is connected to the resistor that is disposed adjacent to the one resistor, a first terminal of another of the plurality of resistors is connected to a second terminal of the resistor that is disposed adjacent to the another resistor, a second terminal of the another resistor is grounded, a first terminal and a second terminal of each of others of the plurality of resistors are respectively disposed adjacent to two of the plurality of resistors, and respectively connected to a second terminal of one of the two resistors and a first terminal of the other of the two resistors;
   a plurality of comparators each having a first input terminal and a second input terminal, wherein the first input terminals of the plurality of comparators are respectively connected to the second terminals of the plurality of first resistors, the second input terminal of each of the plurality of comparators is coupled to a trigger voltage, each of the plurality of comparators is configured to output a comparison signal according to a voltage of the first input terminal of the comparator and a voltage of the second input terminal of the comparator; and a detection control circuit connected to an output terminal of each of the plurality of comparators and configured to output a control signal according to each of the comparison signals;

a compensator circuit connected to the detection control circuit and configured to output a compensating signal according to the control signals;

a main control circuit connected to the compensator circuit and configured to output a main control signal according to the compensating signal; and a switch circuit connected to the main control circuit and configured to operate according to the main control signal.

2. The power converter according to claim 1, wherein the switch circuit is connected to a first terminal of an output inductor, a second terminal of the output inductor is connected in series with an output capacitor and grounded through the output capacitor, and a voltage of an output node between the output inductor and the output capacitor is an output voltage of the power converter.

3. The power converter according to claim 2, wherein a voltage driver circuit is connected to the output node and configured to divide the output voltage to output a feedback voltage.

4. The power converter according to claim 3, wherein the compensator circuit includes:

a plurality of current sources;

an error amplifier, wherein two input terminals of the error amplifier are respectively coupled to a second reference voltage and connected to the voltage driver circuit, and an output terminal of the error amplifier is connected to the current sources;

a plurality of switch components, wherein a plurality of first terminals of the plurality of switch components are respectively connected to the plurality of current sources, and a control terminal of each of the plurality of switch components is connected to an output terminal of the detection control circuit;

a second resistor, wherein a first terminal of the second resistor is connected to a second terminal of each of the plurality of switch components and an input terminal of the main control circuit; and a first capacitor, wherein a first terminal of the first capacitor is connected to a second terminal of the second resistor, and a second terminal of the first capacitor is grounded.

5. The power converter according to claim 3, wherein the compensator circuit includes:

an error amplifier, wherein two input terminals of the error amplifier are respectively coupled to a second reference voltage and connected to the voltage driver circuit;

a plurality of second resistors, wherein a first terminal of each of the plurality of second resistors is connected to an output terminal of the error amplifier and an input terminal of the main control circuit;

a plurality of switch components, wherein a plurality of first terminals of the plurality of switch components are respectively connected to second terminals of the plurality of second resistors, and a control terminal of each of the plurality of switch components is connected to an output terminal of the detection control circuit; and a capacitor, wherein a terminal of the capacitor is connected to a second terminal of each of the plurality of switch components, and another terminal of the capacitor is grounded.

6. The power converter according to claim 3, wherein the compensator circuit includes:

an error amplifier, wherein two input terminals of the error amplifier are respectively coupled to a second reference voltage and connected to the voltage driver circuit;

a second resistor, wherein a first terminal of the second resistor is connected to an output terminal of the error amplifier and an input terminal of the main control circuit;

a plurality of switch components, wherein a first terminal of each of the plurality of switch components is connected to a second terminal of the second resistor, and a control terminal of each of the plurality of switch components is connected to an output terminal of the detection control circuit; and a plurality of capacitors, wherein a plurality of first terminals of the plurality of capacitors are respectively connected to second terminals of the plurality of switch components, and a second terminal of each of the plurality of capacitors is grounded.

7. The power converter according to claim 3, wherein the compensator circuit includes:

an error amplifier, wherein two input terminals of the error amplifier are respectively coupled to a second reference voltage and connected to the voltage driver circuit;

a second resistor, wherein a first terminal of the second resistor is connected to an output terminal of the error amplifier and an input terminal of the main control circuit;

a first capacitor, wherein a terminal of the first capacitor is connected to a second terminal of the second resistor and another terminal of the first capacitor is grounded;

a plurality of switch components, wherein a first terminal of each of the plurality of switch components is connected to an output terminal of the error amplifier and the input terminal of the main control circuit, and a control terminal of each of the plurality of switch components is connected to an output terminal of the detection control circuit, and a plurality of second capacitors, wherein a plurality of first terminals of the plurality of second capacitors are respectively connected to second terminals of the plurality of switch components, and a second terminal of each of the plurality of second capacitors is grounded.

8. The power converter according to claim 3, wherein the compensator circuit includes:

an operational amplifier having a first input terminal and a second input terminal that are respectively coupled to a second reference voltage and connected to the voltage driver circuit, wherein an output terminal of the operational amplifier is connected to an input terminal of the main control circuit;

a first capacitor connected between the first input terminal of the operational amplifier and the output terminal of the operational amplifier;

a second capacitor, wherein a first terminal of the second capacitor is connected to the first input terminal of the operational amplifier;

a plurality of second resistors connected in series with the second capacitor and connected between the first input terminal of the operational amplifier and the output terminal of the operational amplifier; and a plurality of switch components that are respectively connected in parallel with the plurality of second resistors and connected to an output terminal of the detection control circuit.

* * * * *